United States Patent
Shieh et al.

(10) Patent No.: US 10,123,423 B1
(45) Date of Patent: Nov. 6, 2018

(54) THINNED ELECTRONIC PRODUCT AND MANUFACTURING METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Wei-Ming Shieh, Taipei (TW); Yi-Feng Pu, Taipei (TW); Pei-Hsuan Huang, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/869,282

(22) Filed: Jan. 12, 2018

(30) Foreign Application Priority Data

Jul. 26, 2017 (CN) .......................... 2017 1 0619039

(51) Int. Cl.
*H05K 1/16* (2006.01)
*H05K 1/18* (2006.01)
*H05K 3/00* (2006.01)

(52) U.S. Cl.
CPC .............. *H05K 1/181* (2013.01); *H05K 1/162* (2013.01); *H05K 1/165* (2013.01); *H05K 1/167* (2013.01); *H05K 3/0017* (2013.01)

(58) Field of Classification Search
CPC ...... H05K 1/181; H05K 3/0017; H05K 1/167; H05K 1/165; H05K 1/162
USPC ......................................................... 174/260
See application file for complete search history.

(56) References Cited

U.S. PATENT DOCUMENTS

| 2008/0196930 A1* | 8/2008 | Tuominen ........... H01L 23/5389 174/260 |
| 2015/0076536 A1 | 3/2015 | Ou et al. |
| 2015/0221623 A1 | 8/2015 | Tischler et al. |
| 2016/0138774 A1 | 5/2016 | Joo et al. |

OTHER PUBLICATIONS

Non-Final Office Action issued in U.S. Appl. No. 15/869,303, filed Jan. 12, 2018, dated Aug. 9, 2018.
Non-Final Office Action issued in U.S. Appl. No. 15/696,369, filed Sep. 6, 2017, dated Jul. 31, 2018.

* cited by examiner

*Primary Examiner* — Sherman Ng
(74) *Attorney, Agent, or Firm* — McClure, Qualey & Rodack, LLP

(57) ABSTRACT

A manufacturing method of an electronic product is provided. The manufacturing method includes following steps. Firstly, a conductive circuit is formed on a first surface of a supporting body. Then, an electronic element is disposed on the conductive circuit, and the electronic element is electrically connected to the conductive circuit. Then, a film layer is disposed on the conductive circuit having the electronic element, and the electronic element and the conductive circuit are wrapped between the supporting body and the film layer.

18 Claims, 15 Drawing Sheets

THINNED ELECTRONIC PRODUCT AND MANUFACTURING METHOD THEREOF

This application claims the benefit of People's Republic of China application Serial No. 201710619039.5, filed Jul. 26, 2017, the subject matter of which is incorporated herein by reference.

BACKGROUND OF THE INVENTION

Field of the Invention

The invention relates in general to an electronic product and a manufacturing method thereof, and more particularly to a thinned electronic product and a manufacturing method thereof.

Description of the Related Art

In the manufacturing process of a thinned electronic product currently available in the market, normally a conductive ink is printed on a polymer film to form a conductive circuit, and then an electronic element is bonded on the conductive circuit. Then, the film having the electronic element and the conductive circuit is adhesively bonded on a supporting structure or formed on a supporting structure by an in-mold injection molding technology. While the former manufacturing process has positioning and adhering problems, the latter one has a problem of high yield loss due to the high pressure and high temperature during the in-mold injection process.

Therefore, how to improve the manufacturing process of the thinned electronic product has become a prominent task for the industries.

SUMMARY OF THE INVENTION

The invention is directed to a thinned electronic product and a manufacturing method thereof capable of directly forming a conductive circuit on a supporting body without the need of using an intervening polymer film, not only simplifying the manufacturing process of the electronic product but also saving the material cost of the film.

According to one embodiment of the invention, a manufacturing method of a thinned electronic product is provided. The manufacturing method includes following steps. Firstly, a conductive circuit is formed on a first surface of a supporting body. Then, an electronic element is disposed on the conductive circuit, wherein the electronic element is electrically connected to the conductive circuit. Then, a film layer is disposed on the conductive circuit having the electronic element, wherein the electronic element and the conductive circuit are wrapped between the supporting body and the film layer.

According to another embodiment of the invention, a thinned electronic product is provided. The thinned electronic product includes a supporting body, a conductive circuit, an electronic element and a film layer. The conductive circuit is formed on a first surface of a supporting body. The electronic element is disposed on the conductive circuit, wherein the electronic element is electrically connected to the conductive circuit. The film layer is formed on the conductive circuit having the electronic element, wherein the electronic element and the conductive circuit are wrapped between the supporting body and the film layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements.

Figure 1A:
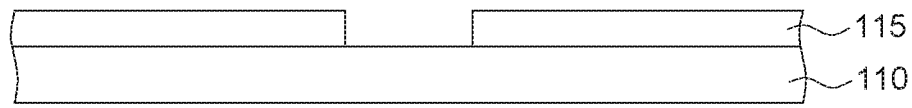
FIGS. 1A-1F are schematic diagrams of a manufacturing method of a thinned electronic product in which a conductive circuit is formed by a hot stamping process according to a first embodiment of the invention.

Refer to FIGS. 1A-1F. The manufacturing method of a thinned electronic product 100 in which a conductive circuit 114' is formed by a hot stamping process according to a first embodiment of the present invention is includes following steps. Firstly, as indicated in FIG. 1A, a patterned hot melt ink layer 115 is formed on a supporting body 110 by a printing process using a laser printer. The patterned hot melt ink layer 115 can be formed of a toner having an organic binder, and the toner may include 20-30% of ceramic powder (such as $F-Fe_3O_4$ crystal powder), 50-60% of polymer resin, 10-20% of charge modifier, fluidizer or surface modifier. The patterned hot melt ink layer 115 has a circuit pattern. After the patterned hot melt ink layer 115 is heated, an adhesion effect will be generated for bonding the patterned hot melt ink layer 115 on the conductive circuit 114' in a hot pressing process. In an embodiment, the supporting body 110 can be formed of any non-conductive organic or inorganic materials such as plastics, ceramics, glass, thermoplastic elastomer, or silicone. The supporting body 110 can be formed of a composite material. Besides, the supporting body 110 can be manufactured using any of the following processes such as lamination process, injection molding process, extrusion molding process, blow molding process, powder metallurgy process, forging process, cutting process, plastic process, or laser melting process, and the invention does not have particular restrictions thereto.

Figure 1B:
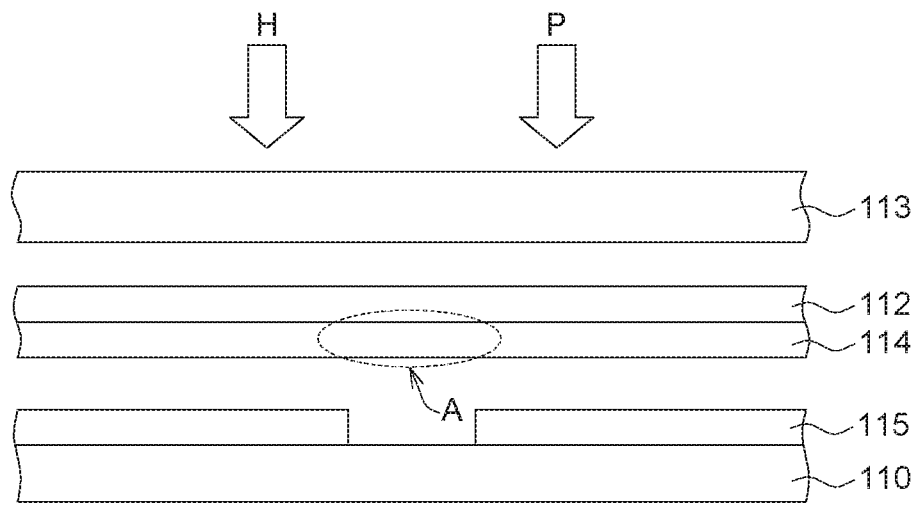
Figure 1C:
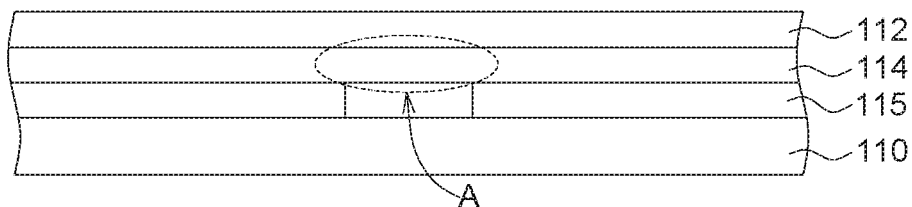

Then, as indicated in FIG. 1B, the stamping plate 113 is formed of a metal (such as zinc or copper), and before a stamping process is performed, the stamping plate 113 is firstly heated by a heater, and then the conductive metal layer 114 having a releasing layer 112, preferably a heat resistant releasing layer, is placed on the patterned hot melt ink layer 115, wherein the heat resistant releasing layer 112 can be selectively disposed on the conductive metal layer 114, that is, the conductive metal layer 114, having the heat resistant releasing layer 112 or the conductive metal layer 114 without the heat resistant releasing layer 112, is placed on the patterned hot melt ink layer 115. The supporting body 110 can be used for a positioning purpose and for applying a pressure.

It is noted that the conductive metal layer without the heat or light resistant releasing layer of all embodiments in the invention is not illustrated in drawings of the present application.

Then, as indicated in FIG. 1B, a heat H and a pressure P are applied to the conductive metal layer 114 having the heat resistant releasing layer 112 through the stamping plate 113 for pressing and fixing a part of the conductive metal layer 114 on the patterned hot melt ink layer 115 to form a conductive circuit 114'. Another part of the conductive metal layer 114 not pressed and fixed on the patterned hot melt ink layer 115 (that is, area A) can be removed or taken off by a brush or a scraper (not illustrated) if the conductive metal layer 114 does not have the heat resistant releasing layer 112 disposed thereon or can be removed or taken off using the heat resistant releasing layer 112 attached to the conductive metal layer 114 as indicated in FIG. 1B if the conductive metal layer 114 has the heat resistant releasing layer 112 disposed thereon.

As indicated in FIG. 1B, the heat resistant releasing layer 112 can separate the stamping plate 113 from the conductive metal layer 114 to avoid the conductive metal layer 114 from being damaged by the stamping plate 113b during the hot pressing process. Thus, the conductive metal layer 114 can be protected. The heat resistant releasing layer 112 is preferably formed of silicone, wax, heat resistant resin or other materials having high resistance against the heat and not easily deformed during the hot pressing process. Besides, the heat resistant releasing layer 112 can be formed of a soft material which can be recycled after use to save the material cost.

As indicated in FIG. 1B, the heat resistant releasing layer 112 and the conductive metal layer 114 can be combined by electrostatic absorption, such that the heat resistant releasing layer 112 and the conductive metal layer 114 can be separated without being fixed to each other. In another embodiment, the heat resistant releasing layer 112 and the conductive metal layer 114 can be combined using a release agent, such that the heat resistant releasing layer 112 and the conductive metal layer 114 can still be separated without being fixed to each other.

Figure 10:
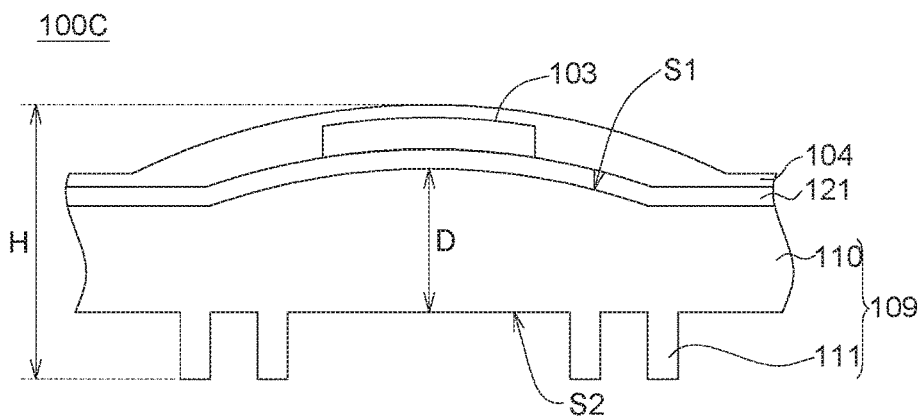
FIG. 10 is a schematic diagram of a thinned electronic product according to another embodiment of the invention.

As indicated in FIG. 10, another part of the conductive metal layer 114 not pressed and fixed (that is, area A) can be removed by peeling off the heat resistant releasing layer 112 and another part of the conductive metal layer 114 attached to the heat resistant releasing layer 112 due to a bonding force between the heat resistant releasing layer 112 and the conductive metal layer 114. That is, the part of the conductive metal layer 114 not peeled off is patterned to form a conductive circuit 114' having a circuit pattern.

Figure 1D:
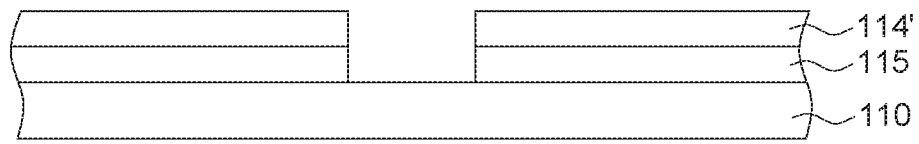

As indicated in FIG. 1D, after the heat resistant releasing layer 112 is peeled off, the conductive metal layer 114' is fixed on the supporting body 110 having the patterned hot melt ink layer 115 to form the conductive circuit 114' having a circuit pattern. It is noted that the conductive circuit 114' of FIG. 1D can be made by other manufacturing methods. For example, in the step as indicated in FIG. 1B, the conductive metal layer 114 can be hot pressed and fixed on the patterned hot melt ink layer 115 by a laminating machine and the other steps can be substantially the same as the hot stamping process.

Figure 1E:
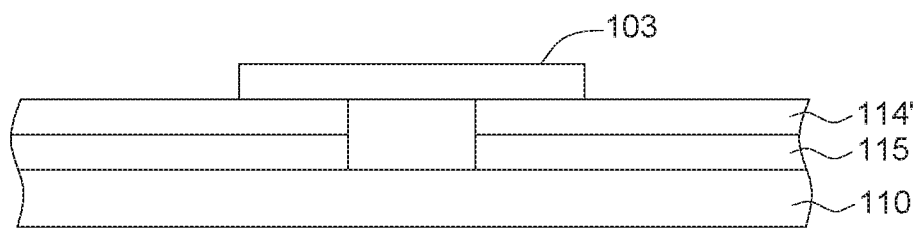

Then, as indicated in FIG. 1E, an electronic element 103 is disposed on the conductive circuit 114'. The electronic element 103 can be an active element, a passive element or a combination thereof such as a resistor, a capacitor, an inductor, a light emitting diode, a transistor, an IC chip, a micro-circuit board, a buzzer, a connector, an amplifier, a sensor, a receiver, an emitter or a switch. The electronic element 103 is electrically connected to the conductive circuit 114' for transmitting or receiving electronic signals and providing touch control, light and/or sound functions through the conductive circuit 114'.

Figure 1F:
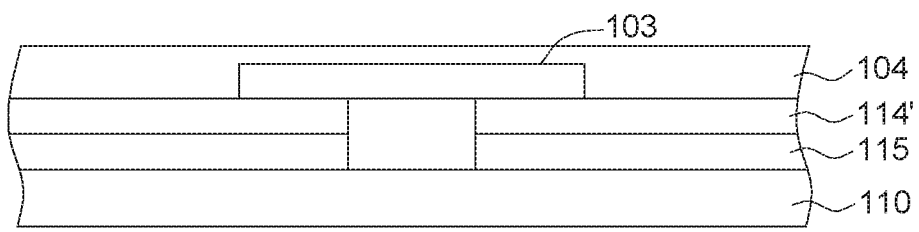

Then, as indicated in FIG. 1F, a film layer 104 is disposed on the conductive circuit 114' having the electronic element 103, wherein the electronic element 103 and the conductive circuit 114' are wrapped between the supporting body 110 and the film layer 104 to form the thinned electronic product 100.

In the present embodiment, the supporting body 110 of the thinned electronic product 100 is exemplified by an unmolded flat plate, and the film layer 104 has a flat surface as exemplified, but the surface of the film layer 104 also can be uneven, or irregular. In another embodiment as indicated in FIG. 10, the first surface S1 of the supporting body 110, the conductive circuit 121 and the film layer 104 of the thinned electronic product 100C can be molded as a non-planar structure by such as a compression molding process, a hot pressing molding process, a cold pressing molding process, a low-pressure molding process, a compressed air molding process, a vacuum molding process, a blow molding forming, a drag molding process or a hydro molding process, and the invention does not have particular restrictions thereto. Detailed descriptions of the molding method of the thinned electronic product 1000 are disclosed below. As disclosed above, the supporting body 110 and the film layer 104 of the thinned electronic products 100, 100A, 100E and 1000 disclosed in following embodiments can be a planar or a non-planar structure, and the similarities are not repeated here.

Figure 2A:
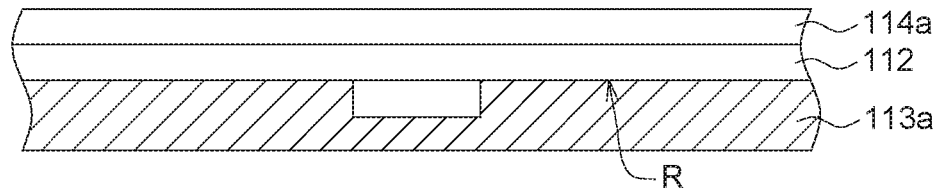
FIGS. 2A-2F are schematic diagrams of a manufacturing method of a thinned electronic product in which a conductive circuit is formed by a hot stamping process according to a second embodiment of the invention.

Refer to FIGS. 2A-2F. A manufacturing method of a thinned electronic product 100 in which a conductive circuit 114' is formed by a hot stamping process according to a second embodiment of the invention includes following steps. Firstly, as indicated in FIG. 2A, a conductive metal layer 114a having a releasing layer 112, preferably a heat resistant releasing layer, is formed on a toppan stamping plate 113a, and the heat resistant releasing layer 112 can be selectively disposed on the conductive metal layer 114a, that is, the conductive metal layer 114a having the heat resistant releasing layer 112 or without the heat resistant releasing layer 112, is placed on the toppan stamping plate 113a. As indicated in FIG. 2A, the heat resistant releasing layer 112 is close to the protrusion R of the toppan stamping plate 113a, the protrusion R has a circuit pattern, and the conductive metal layer 114a has a binder providing adhesion to the conductive metal layer 114a.

Figure 2B:
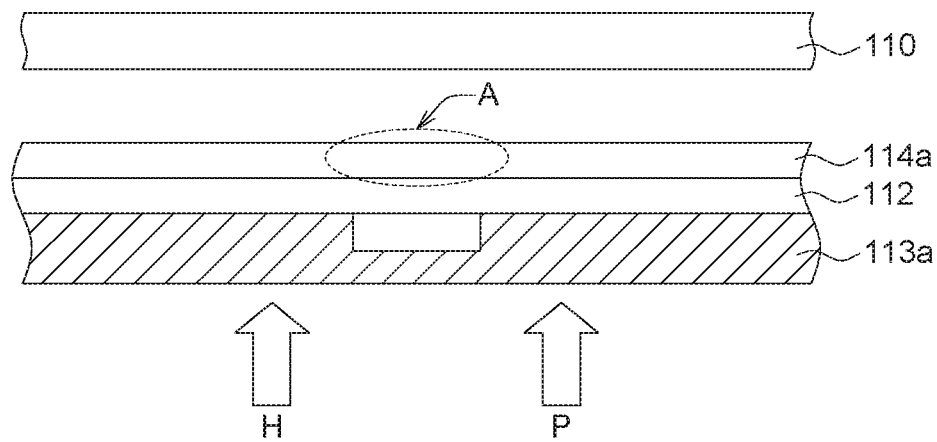
Figure 2C:
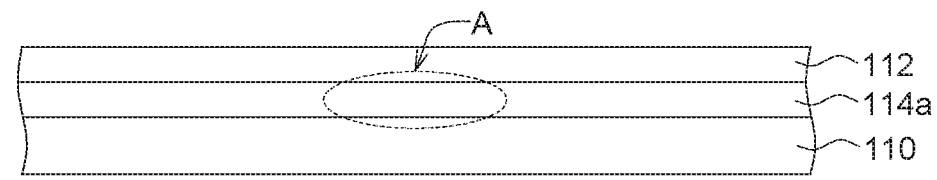
Figure 2D:

As indicated in FIG. 2B, a supporting body 110 is placed on the conductive metal layer 114a having the heat resistant releasing layer 112, and before a stamping process is performed, the toppan stamping plate 113a is firstly heated by a heater. The toppan stamping plate 113a mainly heats and melts the binder of the conductive metal layer 114a. Then, a heat H and a pressure P are applied to the heat resistant releasing layer 112 and the conductive metal layer 114a through the toppan stamping plate 113a, such that when a part of the conductive metal layer 114a is heated, the binder of the part of the conductive metal layer 114a is heated and melted for bonding the part of the conductive metal layer 114a on the supporting body 110. During the hot pressing process, the supporting body 110 can be used for a positioning purpose and for applying a pressure. As indicated in FIG. 2O, the heat resistant releasing layer 112 and another part of the conductive metal layer 114a attached to the heat resistant releasing layer 112 without being pressed and fixed (that is, area A) are peeled off due to a bonding force between the heat resistant releasing layer 112 and the conductive metal layer 114a. As indicated in FIG. 2D, after the heat resistant releasing layer 112 is peeled off, the patterned conductive metal layer 114' is fixed on the supporting body 110 to form a conductive circuit 114' having a circuit pattern. That is, the part of the conductive metal layer 114a not peeled off is patterned to form the conductive circuit 114' having a circuit pattern. In the present embodiment, the function and combination of the heat resistant releasing layer 112 are similar to that disclosed in the first embodiment, and the similarities are not repeated here. It is noted that the conductive circuit 114' of FIG. 2D can be made by other manufacturing methods. For example, in the step as indicated in FIG. 2B, the conductive metal layer 114a can be hot pressed and fixed on the supporting body 110 by a laminating machine and the other steps can be substantially the same as the hot stamping process.

Figure 2E:
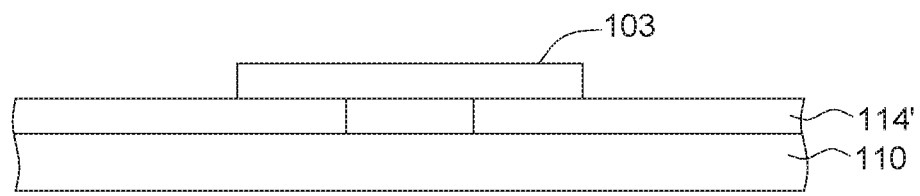
Figure 2F:
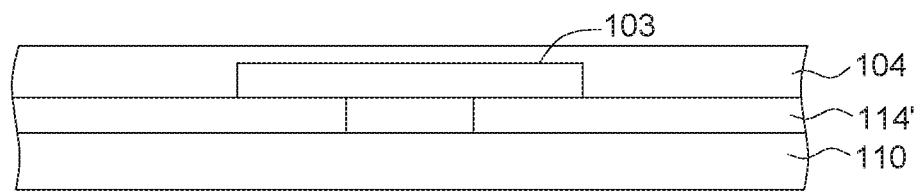

Then, as indicated in FIG. 2E, an electronic element 103 is disposed on the conductive circuit 114'. As indicated in FIG. 2F, a film layer 104 is disposed on the conductive circuit 114' having the electronic element 103, and the electronic element 103 and the conductive circuit 114' are wrapped between the supporting body 110 and the film layer 104 to form the thinned electronic product 100.

Figure 3A:
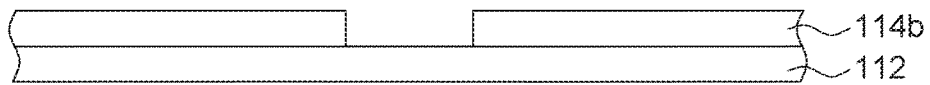
FIGS. 3A-3F are schematic diagrams of a manufacturing method of a thinned electronic product in which a conductive circuit is formed by a hot stamping process according to a third embodiment of the invention.
Figure 3B:
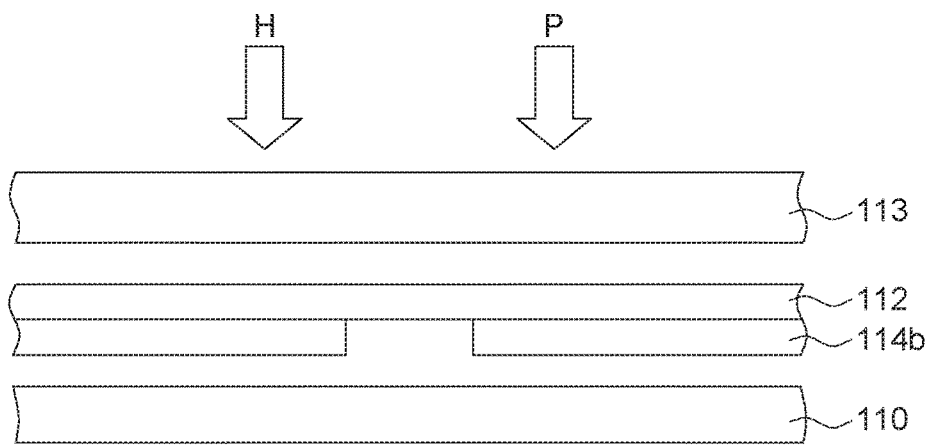
Figure 3C:
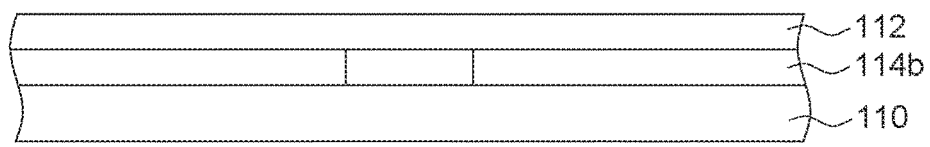
Figure 3D:

Refer to FIGS. 3A-3F. The manufacturing method of a thinned electronic product 100 in which a conductive circuit 114' is formed by a hot stamping process according to a third embodiment of the invention includes following steps. Firstly, as indicated in FIG. 3A, a conductive metal layer 114b having a circuit pattern is selectively formed on a releasing layer 112, preferably a heat resistant releasing layer, and the conductive metal layer 114b contains a binder, which provides adhesion to the conductive metal layer 114b. Before or after the stamping plates 113a and 113b are placed, the conductive metal layer 114b having the circuit pattern along with the heat resistant releasing layer 112 is placed on the supporting body 110. As indicated in FIG. 3B, before a stamping process is performed, the stamping plate 113 is heated by a heater. Then, a heat H and a pressure P are applied to the heat resistant releasing layer 112 and the conductive metal layer 114b through the stamping plate 113, such that when the conductive metal layer 114b having the circuit pattern is heated, the binder of the conductive metal layer 114b is heated and melted for bonding the conductive metal layer 114b on the supporting body 110. The supporting body 110 can be used for the positioning purpose and for applying a pressure. As indicated in FIGS. 3O and 3D, after the heat resistant releasing layer 112 is peeled off, the patterned conductive metal layer 114' (that is, the conductive metal layer 114b) is fixed on the supporting body 110 to form a conductive circuit 114' having a circuit pattern. In the present embodiment, the function and combination of the heat resistant releasing layer 112 are similar to that disclosed in the first embodiment, and the similarities are not repeated here. It is noted that the conductive circuit 114' of FIG. 3D can be made by other manufacturing methods. For example, in the step as indicated in FIG. 3B, the conductive metal layer 114b can be hot pressed and fixed on the supporting body 110 by a laminating machine and the other steps can be substantially the same as the hot stamping process.

Figure 3E:
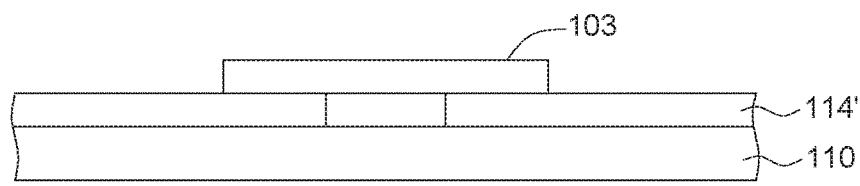
Figure 3F:
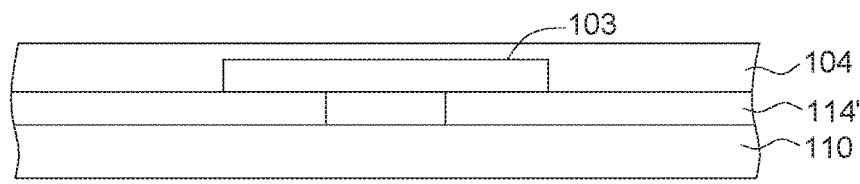

Then, as indicated in FIG. 3E, an electronic element 103 is disposed on the conductive circuit 114'. As indicated in FIG. 2F, a film layer 104 is disposed on the conductive circuit 114' having the electronic element 103, wherein the electronic element 103 and the conductive circuit 114' are wrapped between the supporting body 110 and the film layer 104 to form the thinned electronic product 100.

Figure 4A:
FIGS. 4A-4F are schematic diagrams of a manufacturing method of a thinned electronic product in which a conductive circuit is formed by a cold stamping process according to a fourth embodiment of the invention.
Figure 4B:
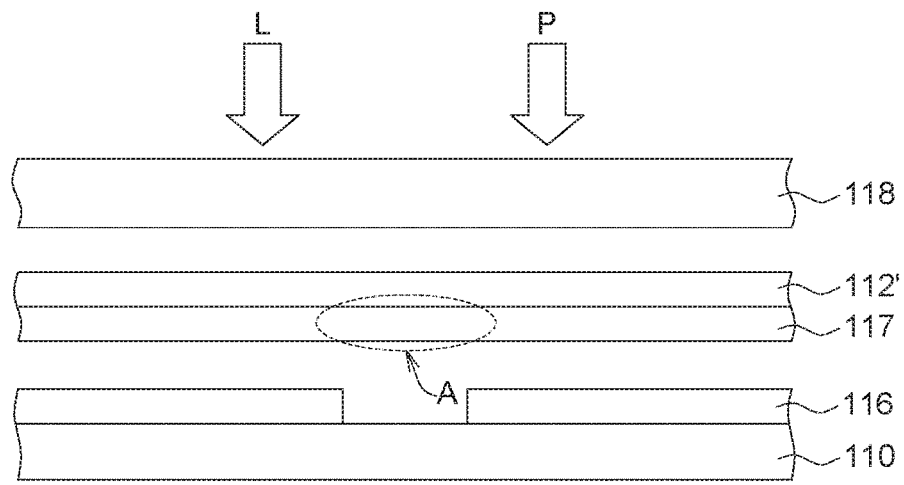
Figure 4C:
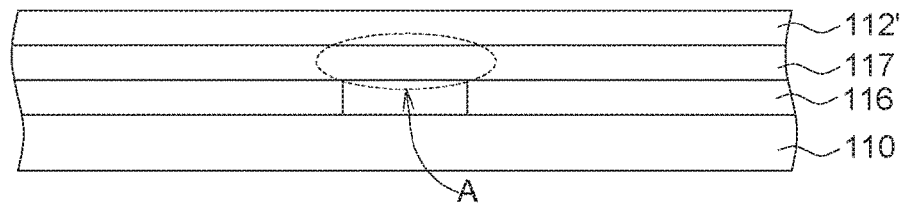
Figure 4D:
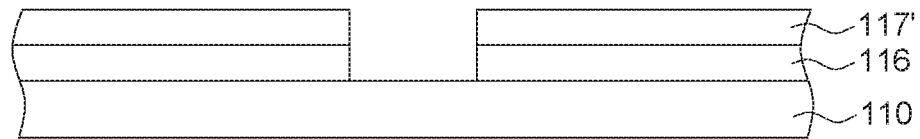

Refer to FIGS. 4A-4F. The manufacturing method of a thinned electronic product 100 in which a conductive circuit 117' is formed by a cold stamping process according to a fourth embodiment of the invention includes following steps. Firstly, as indicated in FIG. 4A, a binder (such as UV curing adhesive) is formed on the supporting body 110 in a printing or a bonding manner to form a patterned binder layer 116 having a circuit pattern. As indicated in FIG. 4B, the conductive metal layer 117 having a resistant releasing layer 112', preferably a light resistant releasing layer, is disposed on the patterned binder layer 116, and the light resistant releasing layer 112' can be selectively disposed on the conductive metal layer 117, that is, the conductive metal layer 117 having the light resistant releasing layer 112' or without the light resistant releasing layer 112' can be placed on the patterned binder layer 116. Then, a pressure P is applied to the conductive metal layer 117 through the pressure plate 118 to press and fix a part of the conductive metal layer 117 onto the patterned binder layer 116 of the supporting body 110, such that the patterned binder layer 116 is irradiated by a UV light (light L) and becomes cured, and the supporting body 110 can be used for the positioning purpose and for applying a pressure. As indicated in FIG. 4O, another part of the conductive metal layer 117 attached onto the light resistant releasing layer 112' without being pressed and fixed (that is, area A) is peeled off due to a bonding force between the light resistant releasing layer 112' and the conductive metal layer 117. As indicated in FIG. 4D, after the light resistant releasing layer 112' is peeled off, the conductive metal layer 117 is patterned and fixed on the supporting body 110 having the patterned binder layer 116 to form a conductive circuit 117' having a circuit pattern. That is, the part of the conductive metal layer 117 not peeled off is patterned to form the conductive circuit 117' having a circuit pattern. It is noted that the conductive circuit 117' of FIG. 4O can be made by other manufacturing methods. For example, in the step as indicated in FIG. 4B, the conductive metal layer 117 can be pressed and fixed on the patterned binder layer 116 by other pressing and curing methods and the other steps can be substantially the same as the cold stamping process.

In the present embodiment, the light resistant releasing layer 112' and the conductive metal layer 117 can be combined by electrostatic absorption or a release agent. Besides, the light resistant releasing layer 112' can separate the pressure plate 118 from the conductive metal layer 117 to avoid the conductive metal layer 117 being damaged by the pressure plate 118 during the cold stamping process. Thus, the conductive metal layer 117 can be protected. The light resistant releasing layer 112' is preferably formed of silicone, wax, a light resistant resin or other light resistant material not easily deteriorated by the light. Besides, the light resistant releasing layer 112' can be formed of a soft material which can be recycled after use to save the material cost.

Figure 4E:
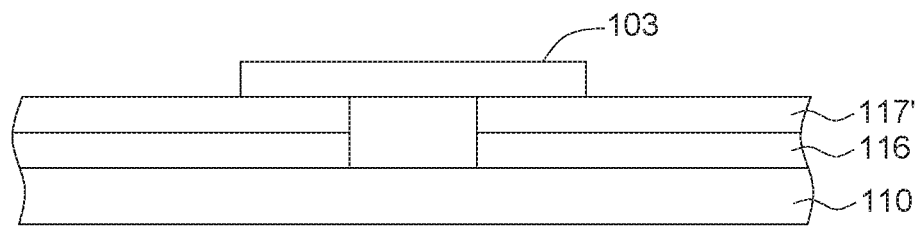
Figure 4F:
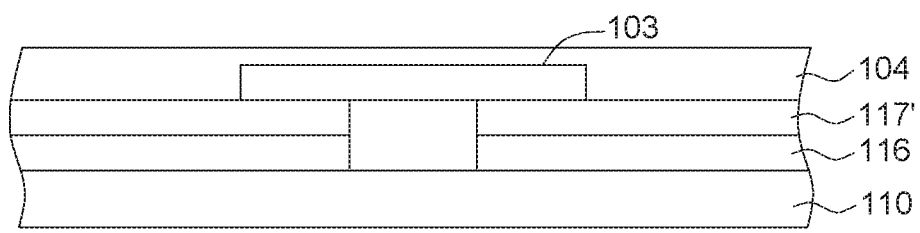

Then, as indicated in FIG. 4E, an electronic element 103 is disposed on the conductive circuit 117'. As indicated in FIG. 4F, a film layer 104 is disposed on the conductive circuit 117' having the electronic element 103, and the electronic element 103 and the conductive circuit 117' are wrapped between the supporting body 110 and the film layer 104 to form the thinned electronic product 100.

Figure 5A:
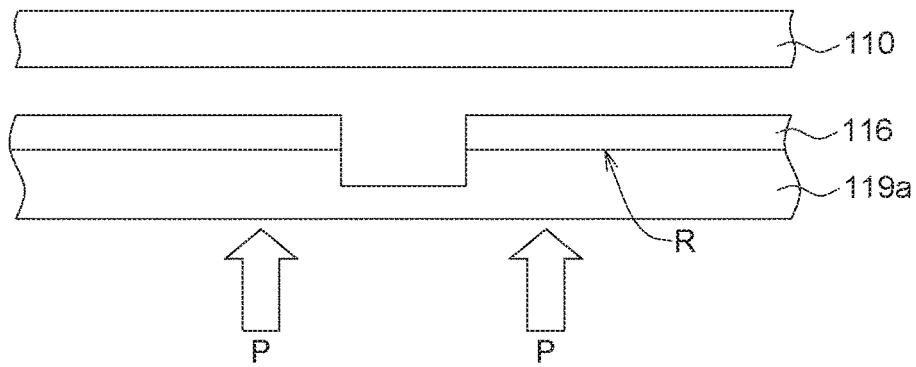
FIGS. 5A-5F are schematic diagrams of a manufacturing method of a thinned electronic product in which a conductive circuit is formed by a cold stamping process according to a fifth embodiment of the invention.
Figure 5B:
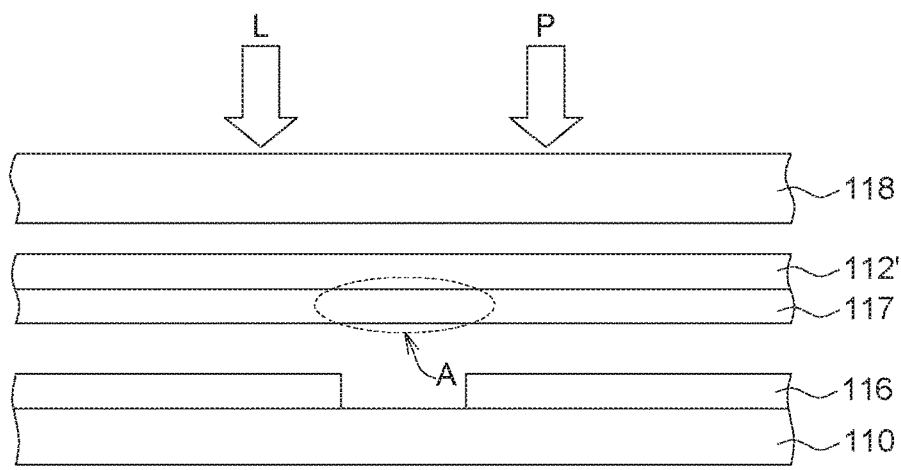
Figure 5C:
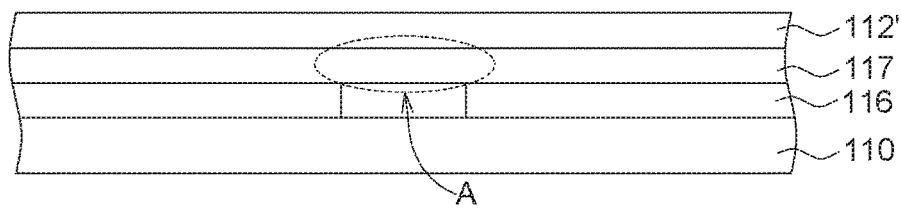
Figure 5D:
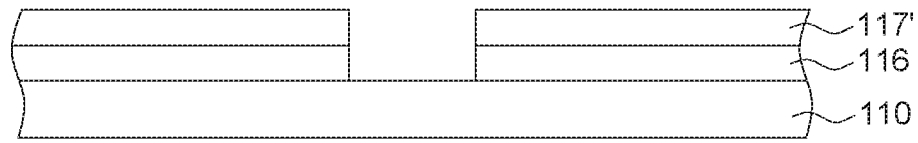

Refer to FIGS. 5A-5D. The manufacturing method of a thinned electronic product 100 in which a conductive circuit 117' is formed by a cold stamping process according to a fifth embodiment of the invention includes following steps. Firstly, as indicated in FIG. 5A, a binder (such as UV curing adhesive) is bonded on the protrusion R of a toppan 119a, and the protrusion R of the toppan 119a forms a circuit pattern used for forming the pattern of a patterned binder layer 116. Then, the supporting body 110 is placed on the patterned binder layer 116 and the patterned binder layer 116 is transfer-printed on the supporting body 110 using a pressure P. As indicated in FIG. 5B, a conductive metal layer 117 having a releasing layer 112', preferably a light resistant releasing layer, is disposed on the patterned binder layer 116, and the light resistant releasing layer 112' can be selectively disposed on the conductive metal layer 117, that is, the conductive metal layer 117 having the light resistant releasing layer 112' or without the light resistant releasing layer 112', is placed on the patterned binder layer 116, and a pressure P is applied to the conductive metal layer 117 through the pressure plate 118 to press and fix a part of the conductive metal layer 117 on the patterned binder layer 116 of the supporting body 110, and the patterned binder layer 116 is irradiated by a UV light (light L) and becomes cured, and the supporting body 110 can be used for the positioning purpose and for applying a pressure. As indicated in FIG. 5C, another part of the conductive metal layer 117 attached to the light resistant releasing layer 112 without being pressed and fixed (that is, area A) is peeled off due to a bonding force between the light resistant releasing layer 112' and the conductive metal layer 117. As indicated in FIG. 5D, after the light resistant releasing layer 112' is peeled off, the conductive metal layer 117' is patterned and fixed on the supporting body 110 having the patterned binder layer 116 to form a conductive circuit 117' having a circuit pattern. In the present embodiment, the function and combination of the light resistant releasing layer 112' are similar to that disclosed in the fourth embodiment, and the similarities are not repeated here. It is noted that the conductive circuit 117' of FIG. 5D can be made by other manufacturing methods. For example, in the step as indicated in FIG. 5B, the conductive metal layer 117 can be pressed and fixed on the patterned binder layer 116 by other pressing and curing methods and the other steps can be substantially the same as the cold stamping process.

Figure 5E:
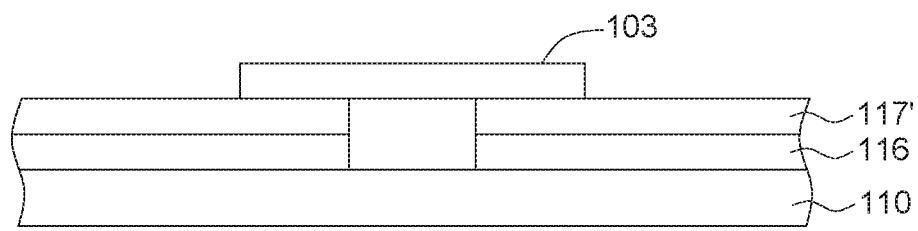
Figure 5F:
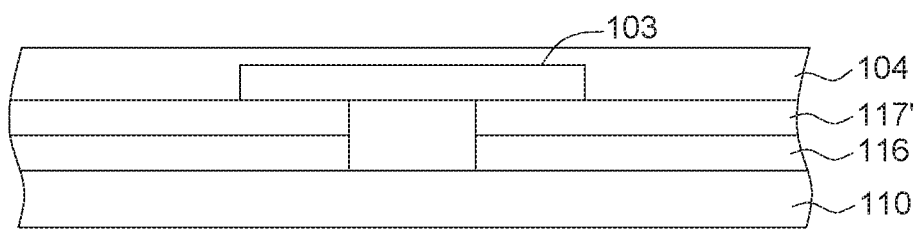

Then, as indicated in FIG. 5E, an electronic element 103 is disposed on the conductive circuit 117'. As indicated in FIG. 5F, a film layer 104 is disposed on the conductive circuit 117' having the electronic element 103, and the electronic element 103 and the conductive circuit 117' are wrapped between the supporting body 110 and the film layer 104 to form the thinned electronic product 100.

Figure 6A:
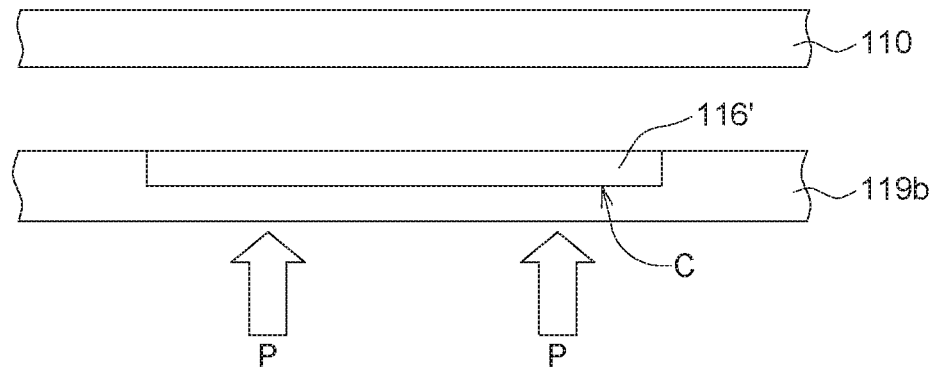
FIGS. 6A-6F are schematic diagrams of a manufacturing method of a thinned electronic product in which a conductive circuit is formed by a cold stamping process according to a sixth embodiment of the invention.
Figure 6B:
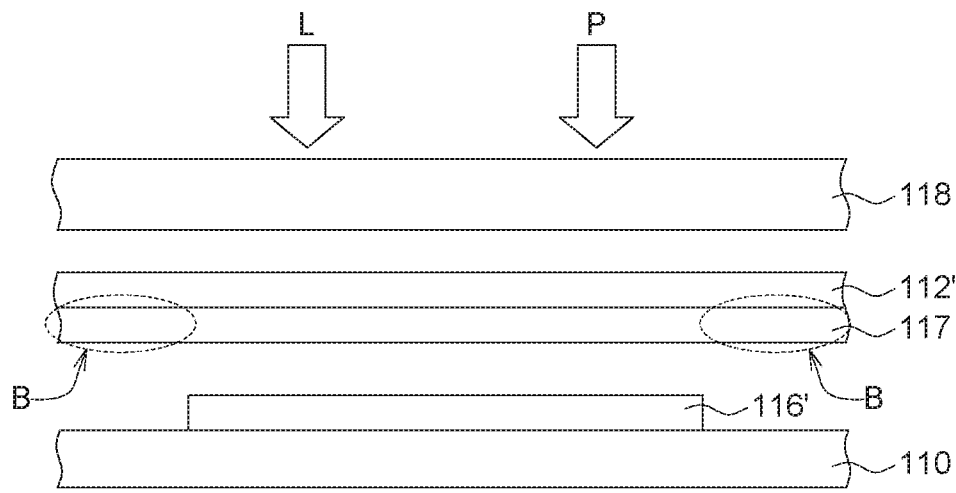
Figure 6C:
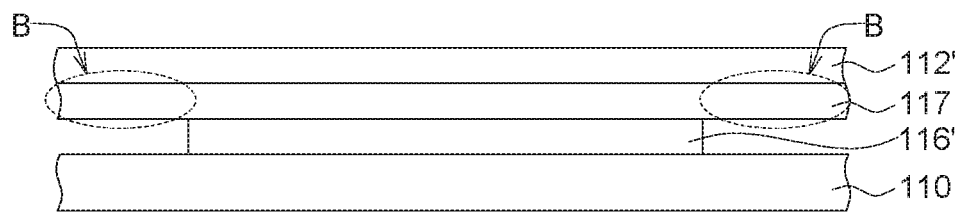
Figure 6D:
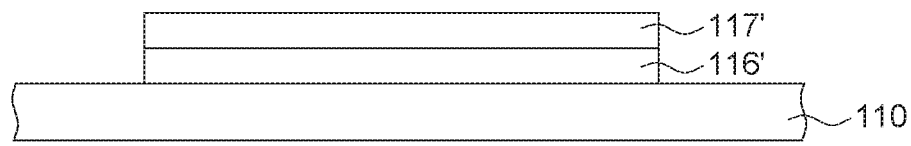

Refer to FIGS. 6A-6F. The manufacturing method of a thinned electronic product 100 in which a conductive circuit 117' is formed by a cold stamping process according to a sixth embodiment of the invention includes following steps. Firstly, as indicated in FIG. 6A, a binder (such as UV curing adhesive) is infused to the groove C of an intaglio stamping plate 119b, and the groove C of the intaglio stamping plate 119b forms a circuit pattern used for forming the pattern of the patterned binder layer 116'. Then, the supporting body 110 is disposed on the patterned binder layer 116' and the patterned binder layer 116' is transfer-printed on the supporting body 110 using a pressure P. As indicated in FIG. 6B, a conductive metal layer 117 having a resistant releasing layer 112', preferably a light resistant releasing layer, is disposed on the patterned binder layer 116', and the light resistant releasing layer 112' can be selectively disposed on the conductive metal layer 117, that is, the conductive metal layer 117 having the light resistant releasing layer 112' or without having the light resistant releasing layer 112', is placed on the patterned binder layer 116' and a pressure P is applied to the light resistant releasing layer 112' and the conductive metal layer 117 through the pressure plate 118 to press and fix a part of the conductive metal layer 117 on the patterned binder layer 116' of the supporting body 110, and the patterned binder layer 116' is irradiated by a UV light (light L) and becomes cured, and the supporting body 110 can be used for the positioning purpose and for applying a pressure. As indicated in FIG. 6O, another part of the conductive metal layer 117 attached to the light resistant releasing layer 112' without being pressed and fixed (that is, area B) is peeled off due to a bonding force between the light resistant releasing layer 112' and the conductive metal layer 117. As indicated in FIG. 6D, after the light resistant releasing layer 112' is peeled off, the conductive metal layer 117 is patterned and fixed on the supporting body 110 having the patterned binder layer 116' to form the conductive circuit 117' having a circuit pattern. In the present embodiment, the function and combination of the heat resistant releasing layer 112' are similar to that disclosed in the fourth embodiment, and the similarities are not repeated here.

Figure 6E:
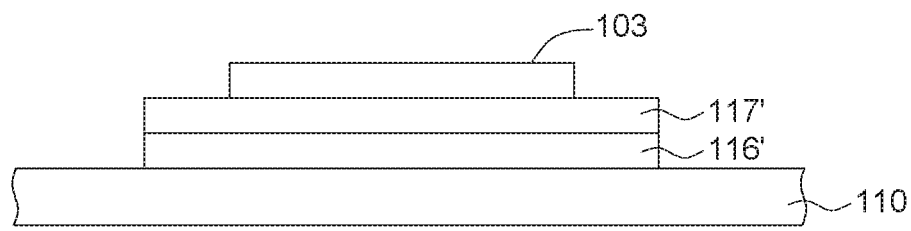
Figure 6F:
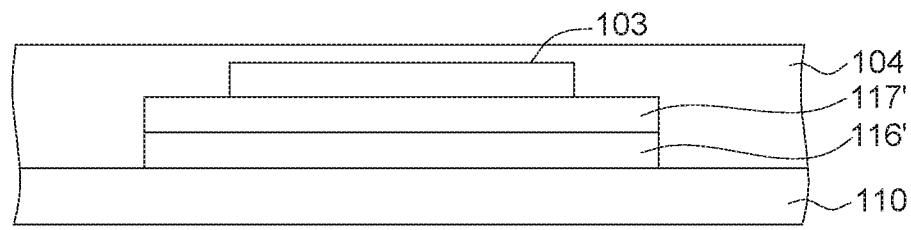

Then, as indicated in FIG. 6E, an electronic element 103 is disposed on the conductive circuit 117'. As indicated in FIG. 6F, a film layer 104 is disposed on the conductive circuit 117' having the electronic element 103, and the electronic element 103 and the conductive circuit 117' are wrapped between the supporting body 110 and the film layer 104 to form the thinned electronic product 100. It is noted that the conductive circuit 117' of FIG. 6D can be made by other manufacturing methods. For example, in the step as indicated in FIG. 6B, the conductive metal layer 117 can be pressed and fixed on the patterned binder layer 116' by other pressing and curing methods and the other steps can be substantially the same as the cold stamping process.

Figure 7A:
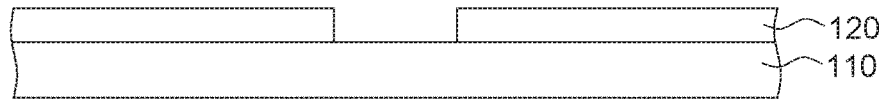
FIGS. 7A-7C are schematic diagrams of a manufacturing method of a thinned electronic product in which a conductive circuit is formed by a printing process or a transferring process according to a seventh embodiment of the invention.
Figure 7B:
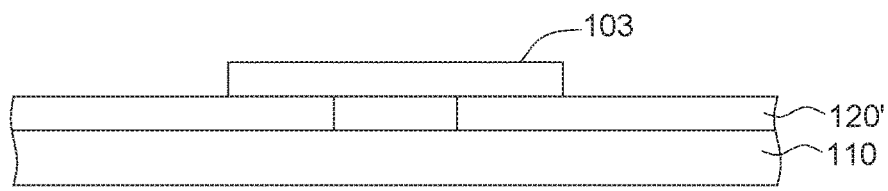
Figure 7C:
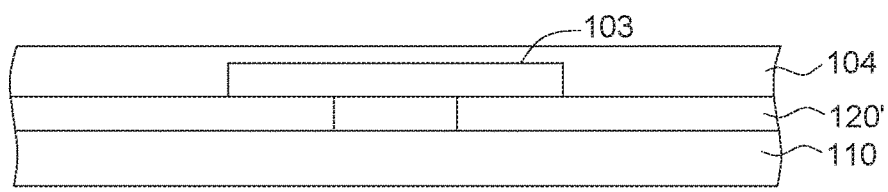

Refer to FIGS. 7A-7O. A manufacturing method of a thinned electronic product 100 in which a conductive circuit 120' is formed by a transfer-printing process or a screen-printing process according to a seventh embodiment of the invention includes following steps. Firstly, as indicated in FIG. 7A, a patterned conductive ink layer 120 is formed on the supporting body 110 by a transfer-printing process or a screen-printing process, Then, as indicated in FIG. 7B, a curing process using such as light or heat is performed on the patterned conductive ink layer 120 to form a conductive circuit 120' having a circuit pattern on the supporting body 110. The patterned conductive ink layer 120 has a polymer resin or a binder and a conductive material, and the patterned conductive ink layer 120 is bonded on the supporting body 110 by the binder, and the conductive material provides conductivity to the patterned conductive ink layer 120 which is used as a conductive circuit 120'. The binder can be a heat curing adhesive or a UV curing adhesive which fixes the patterned conductive ink layer 120 on the supporting body 110 after the patterned conductive ink layer 120 is heated or irradiated by a light.

Then, as indicated in FIG. 7B, an electronic element 103 is disposed on the conductive circuit 120'. As indicated in FIG. 7O, a film layer 104 is disposed on the conductive circuit 120' having the electronic element 103, and the electronic element 103 and the conductive circuit 120' are wrapped between the supporting body 110 and the film layer 104 to form the thinned electronic product 100.

In the first embodiment to the sixth embodiment, each of the conductive circuits 114' and 117' can be formed of a metal foil. That is, each of the conductive metal layers 114, 114a, 114b, 117 is a metal foil formed by a material including gold, silver, copper, iron, aluminum, nickel, zinc, tungsten or an alloy thereof. In the seventh embodiment, the conductive circuit 120' can be a conductive ink composed by a conductive material such as gold, silver, copper, iron, aluminum, nickel, zinc, tungsten, carbon or a composite material thereof. Besides, the conductive circuits 114', 117' and 120' are not limited to single-layer structures, and can also be multi-layer structures. If the conductive circuit is a multi-layer structure, every two adjacent layers can be separated by an insulating layer formed of a non-conductive material.

In each of the embodiments disclosed above, the supporting body 110 is a thinned supporter with a predetermined supporting force or strength and provides a suitable bearing capacity to the conductive circuit and the electronic element or other film layers stacked on the supporting body 110 and/or to structural functional members (such as microstructures) combined under the supporting body 110. The supporting body 110 can be formed of plastics, ceramics, glass, thermoplastic elastomer, silicone or other materials. If the supporting body 110 is formed of plastics, the thickness of the supporting body 110 is preferably larger than 0.3 mm.

Figure 8:
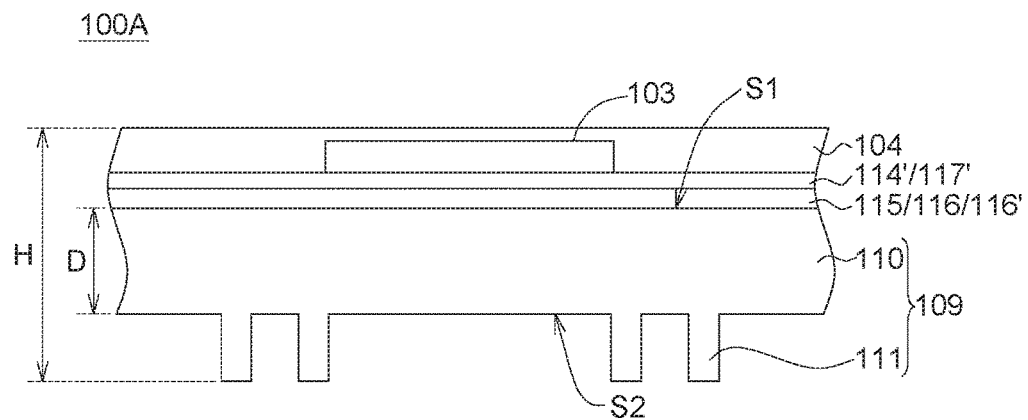
FIG. 8 is a schematic diagram of a thinned electronic product according to another embodiment of the invention.
Figure 9:
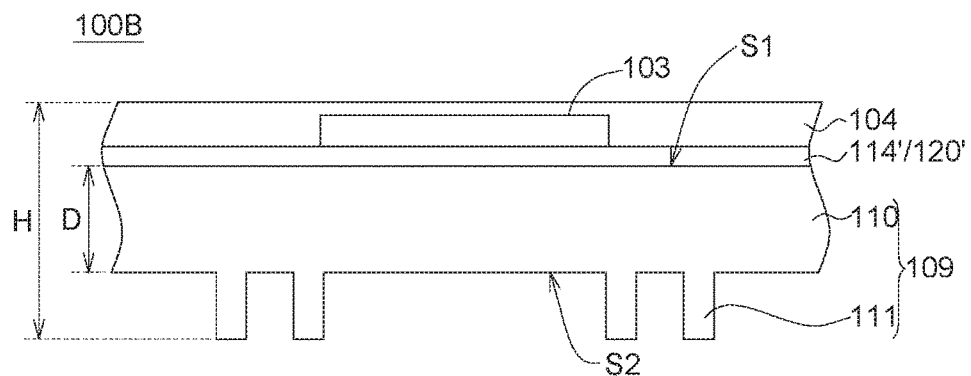
FIG. 9 is a schematic diagram of a thinned electronic product according to another embodiment of the invention.

Referring to FIG. 8, FIG. 9 and FIG. 10, schematic diagrams of thinned electronic products 100A, 100B and 1000 according to another embodiment of the invention are respectively shown. As indicated in FIGS. 8, 9 and 10, the supporting body 110 can be formed of plastics, ceramics, glass, thermoplastic elastomers, silicone and so on, and the supporting body 110 has a thickness D larger than 0.3 mm (such as larger than 1 cm), and can be a casing (an external view layer), a base, a component, an element, a part, an electromagnetic shielding piece or an interconnection device. In an embodiment, the supporting body 110 can be a component 109 of the thinned electronic product, and the component 109 may optionally include a structural function component 111. If the supporting body 110 does not provide any joint function, the second surface S2 of the supporting body 110 and another component of the thinned electronic product 100 can be adhesively bonded and combined. If the supporting body 110 has a joint structure, the supporting body 110 and another component of the thinned electronic product 100 can be jointed through the joint structure. The joint structure can be realized by a buckling structure or a positioning structure, and detailed descriptions are disclosed below.

The supporting body 110 has a first surface S1 and a second surface S2 opposite to the first surface S1. The first surface S1 can be an outer surface, and the second surface S2 can be an inner surface, or the other way around. The first surface S1 of the supporting body 110 is not limited to a planar surface, and can be a 2.5 dimensional or a 3 dimensional surface (such as an arced surface, an oval surface as indicated in FIG. 10 or other shapes of surface). Besides, the second surface S2 of the supporting body 110 can further have a structural function component 111 disposed thereon. The structural function component 111 can be a reinforced structure, a buckling structure or a positioning structure. The reinforced structure, which can be latticed ribs, reinforces the strength of the supporting body 110. The buckle structure can be hooks. The positioning structure can be plugs. For example, if the thinned electronic product 100 has a man-machine interface, the supporting body 110 can be engaged/positioned with another component through the buckling/positioning structure. Besides, the total height from the structural function component 111 of the supporting body 110 to the film layer 104 on the outmost side preferably is between 0.3 mm and 5 cm, such that the thinness requirement can be satisfied.

Refer to FIG. 8. According to the thinned electronic product 100 of the first embodiment, a patterned hot melt ink layer 115, a conductive circuit 114, an electronic element 103 and at least a film layer 104 are sequentially formed on the first surface S1 of the supporting body 110 in order. According to the thinned electronic product 100 of the fourth embodiment, the fifth embodiment and the sixth embodiment, a patterned binder layer 116 (116'), a conductive circuit 117', an electronic element 103 and at least a film layer 104 are sequentially formed on the first surface S1 of the supporting body 110 in order. Refer to FIG. 9. According to the thinned electronic product 100 of the second embodiment and the third embodiment, a conductive circuit 114', an electronic element 103 and at least a film layer 104 are sequentially formed on the first surface S1 of the supporting body 110. According to the thinned electronic product 100 of the seventh embodiment, a conductive circuit 120' (that is, the patterned conductive ink layer 120), an electronic element 103 and at least a film layer 104 are sequentially formed on the first surface S1 of the supporting body 110. Details of the manufacturing method of the thinned electronic products 100A, 100B and 1000 can be made by the methods already disclosed in the first to the seventh embodiments, and the similarities are not repeated here. It is noted that the conductive circuits formed of a metal foil in the thinned electronic products 100A, 100B and 100C can be made by other manufacturing methods of heating, pressing or curing in addition to the hot stamping or cold stamping processes illustrated in the above embodiments.

As indicated in FIG. 10, the conductive circuit 121 can be the conductive circuits 114', 117', and 120' of FIG. 8 or FIG. 9, but it is different from the conductive circuits 114', 117', and 120' of FIG. 8 or FIG. 9 in that: the thinned electronic product 1000 can be molded before or after the conductive circuit 121, the electronic element 103 and the film layer 104 are formed. For example, before the film layer 104 is formed, the supporting body 100 having the electronic element 103 and the conductive circuit 121 can be integrally molded in one piece having an uneven surface (arced surface as exemplified), and then the film layer 104 is formed on the molded supporting body 100 having the electronic element 103 and the conductive circuit 121. Or, before the film layer 104 and the electronic element 103 are formed, the supporting body 100 having the conductive circuit 121 can be integrally molded in one piece having an uneven surface, and then the electronic element 103 and the film layer 104 are sequentially formed on the molded supporting body 100 having the conductive circuit 121. Or, after the film layer 104, the electronic element 103 and the conductive circuit 121 are formed, the supporting body 100 having the film layer 104, the electronic element 103 and the conductive circuit 121 can be integrally molded in one piece having an uneven surface.

In each of the embodiments disclosed above, the film layer 104 can be formed on the supporting body 110 having the electronic element 103 and the conductive circuit by an out-mold wrapping process, a high temperature vacuum adsorption process, a hot pressing process, an ultrasonic melting process, a melt bonding process or an adhesive bonding process. According to the out-mold wrapping method, the thereto-formable film layer 104 is attached to the supporting body 110 by a vacuum and positioning system at a specific temperature, and after the film layer 104 is heated and becomes deformed, the film layer 104 is tightly wrapped on the supporting body 110 and provides a tight wrapping effect which can hardly be removed by an external force. Besides, the film layer 104 can also be formed on the supporting body 110 having the electronic element 103 and the conductive circuit by an in-mold forming technology.

The supporting body 110 or the film layer 104 can be used as an external view layer, and has waterproof, anti-shock (anti-collision and anti-drop) and dustproof functions. In response to actual needs, the external view layer can be a transparent layer or a non-transparent layer. In the present embodiment, the film layer 104 is not limited to a single-layer structure and can also be a multi-layer structure. The film layer 104 can be a functional film layer having at least one of waterproof function, dustproof function and/or other functions to avoid the electronic element 103 and the conductive circuit being affected by moisture or dust. The film layer 104 can be formed of any organic or inorganic materials such as plastics, ceramics, glass, metal, thermoplastic elastomer or silicone. The film layer 104 can be formed of a composite material. Refer to FIGS. 11A-11D. In response to the needs, the film layer 104 of the thinned electronic product 100 of the invention can adaptively include at least one functional film layer 105 selected from a group composed of a heat dissipation layer, a light guide layer, an external view ink layer, a waterproof layer, an adhesive layer, an electromagnetic wave shielding layer, a chemical resistant layer and a supporting layer. The position of the functional film layer 105 depends on actual needs, and detailed descriptions of the functional film layer 105 are made with reference to FIGS. 11A-11D.

Figure 11A:
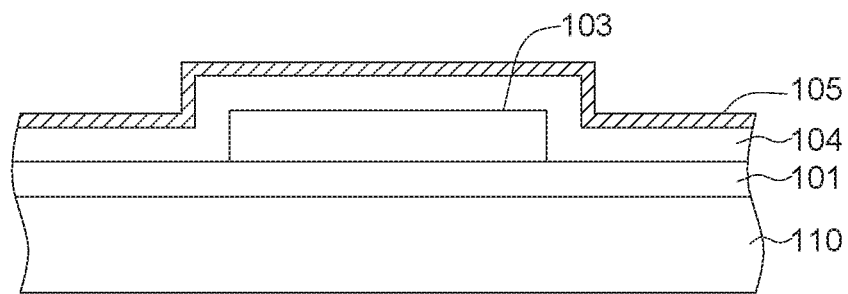
FIGS. 11A-11D are schematic diagrams of a thinned electronic product having a functional film layer according to an embodiment of the invention.
Figure 11B:
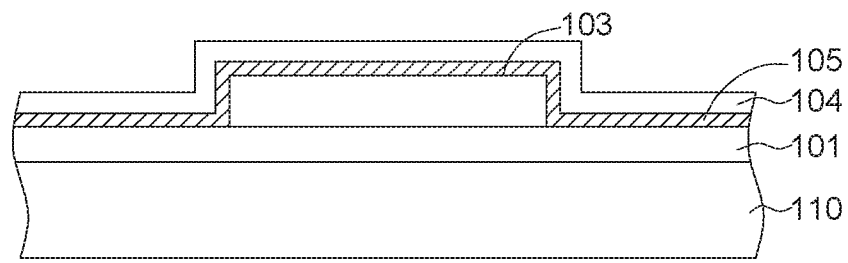
Figure 11C:
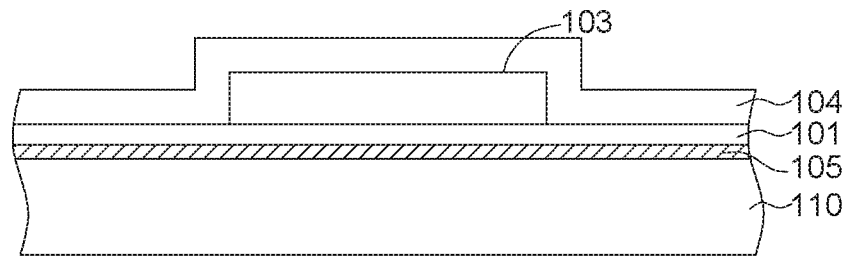
Figure 11D:
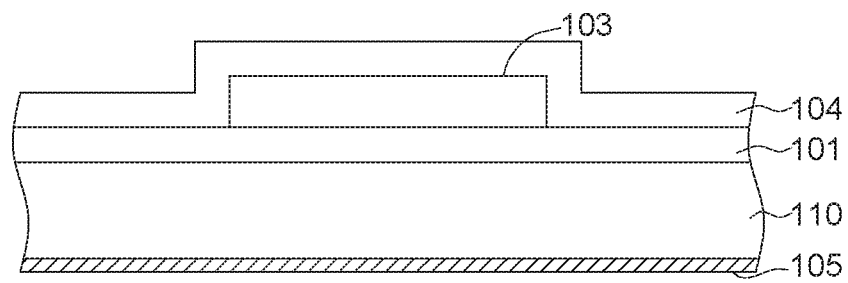

Refer to FIG. 11A. The functional film layer 105 can be selectively formed on a first surface of the film layer 104. Refer to FIG. 11B, the functional film layer 105 covers the electronic element 103 and the conductive circuit 102, and the film layer 104 covers the functional film layer 105. Refer to FIG. 11O. The functional film layer 105 can be interposed between the conductive circuit 101 and the supporting body 110. Refer to FIG. 11D. The functional film layer 105 can be located on a first surface of the supporting body 110, and the invention does not have particular restrictions. The conductive circuit 101 can be formed by the hot stamping process disclosed in the first embodiment to the third embodiment, the cold stamping process disclosed in the fourth embodiment to the sixth embodiment, or the transfer-printing process or the screen-printing process disclosed in the seventh embodiment, and the invention does not have particular restrictions thereto.

According to the manufacturing method of an electronic product disclosed in above embodiments of the invention, a conductive circuit is directly formed on a supporting body by a hot stamping process, a cold stamping process, a transfer-printing process or a screen-printing process and does not need to be formed on the polymer film first and then formed on the supporting body. Since one film layer is omitted and the yield rate problem of bonding the polymer film and the supporting structure is also reduced, the manufacturing process of the electronic product is simplified and the material cost of film is saved. Besides, the invention can be used in thinned electronic products with human-machine interface. For example, the invention can be used in the control panel of consumer electronic products (such as microwaves, ovens, electric cookers, gas stoves, toasters, fridges, washing machines, dryers, showers, toilets, audio equipment, notebook computers, remote controllers, keyboards or printers), and the control panel of vehicle parts (such as sunroof consoles, air conditioners and vehicle/motorbike dashboards).

While the invention has been described by way of example and in terms of the preferred embodiment(s), it is to be understood that the invention is not limited thereto. On the contrary, it is intended to cover various modification and similar arrangements and procedures, and the scope of the appended claims therefore should be accorded the broadest interpretation so as to encompass all such modification and similar arrangements and procedures.

What is claimed is:

1. A manufacturing method of a thinned electronic product, comprising: forming a conductive circuit on a first surface of a supporting body; disposing an electronic element on the conductive circuit, wherein the electronic element is electrically connected to the conductive circuit; and disposing a film layer on the conductive circuit having the electronic element, wherein the electronic element and the conductive circuit are wrapped between the supporting body and the film layer, wherein the conductive circuit is made of a conductive metal layer, the conductive metal layer is a metal foil and the conductive metal layer is patterned to form the conductive circuit, and forming the conductive circuit comprises: forming a patterned ink layer having a circuit pattern on the supporting body; placing the conductive metal layer on the patterned ink layer; hot pressing the conductive metal layer to press and fix a part of the conductive metal layer on the patterned ink layer to form the patterned conductive metal layer having the circuit pattern on the patterned ink layer; and removing another part of the conductive metal layer not pressed and fixed on the patterned ink layer.

2. The manufacturing method according to claim 1, further comprising: disposing a heat resistant releasing layer on the conductive metal layer and placing the conductive metal layer having the heat resistant releasing layer on the patterned ink layer, and peeling off the heat resistant releasing layer and the another part of the conductive metal layer attached to the heat resistant releasing layer to remove another part of the conductive metal layer not pressed and fixed.

3. The manufacturing method according to claim 1, wherein the conductive circuit is made of a conductive metal layer, the conductive metal layer is a metal foil and the conductive metal layer is patterned to form the conductive circuit, and forming the conductive circuit comprises: placing the conductive metal layer on a toppan stamping plate, wherein a protrusion of the toppan stamping plate forms a circuit pattern, and the conductive metal layer contains a binder; placing the supporting body on the conductive metal layer; hot pressing the conductive metal layer through the toppan stamping plate to press and fix a part of the conductive metal layer on the supporting body to from the patterned conductive metal layer having the circuit pattern on the supporting body; and removing another part of the conductive metal layer not pressed and fixed on the supporting body.

4. The manufacturing method according to claim 3, further comprising: disposing a heat resistant releasing layer on the conductive metal layer and placing the conductive metal layer having the heat resistant releasing layer on the toppan stamping plate, and peeling off the heat resistant releasing layer and the another part of the conductive metal layer attached to the heat resistant releasing layer to remove another part of the conductive metal layer not pressed and fixed.

5. The manufacturing method according to claim 1, wherein the conductive circuit is made of a conductive metal layer, the conductive metal layer is a metal foil, and forming the conductive circuit comprises: forming the conductive metal layer having a circuit pattern on the supporting body, wherein the conductive metal layer contains a binder; hot pressing the conductive metal layer to press and fix the conductive metal layer on the supporting body to form the conductive metal layer having the circuit pattern on the supporting body.

6. The manufacturing method according to claim 5, further comprising: disposing a heat resistant releasing layer on the conductive metal layer and placing the conductive metal layer having the heat resistant releasing layer on the supporting body and peeling off the heat resistant releasing layer.

7. The manufacturing method according to claim 1, wherein the conductive circuit is made of a conductive metal layer, the conductive metal layer is a metal foil and the conductive metal layer is patterned to form the conductive circuit, and forming the conductive circuit comprises: forming a patterned binder layer having a circuit pattern on the supporting body; placing the conductive metal layer on the patterned binder layer; applying a pressure to press and fix a part of the conductive metal layer on the patterned binder layer, and curing the patterned binder layer to form the patterned conductive metal layer having the circuit pattern on the supporting body; and removing another part of the conductive metal layer not pressed and fixed.

8. The manufacturing method according to claim 1, wherein the conductive circuit is made of a conductive metal layer, the conductive metal layer is a metal foil and the conductive metal layer is patterned to form the conductive circuit, and forming the conductive circuit comprises: forming a patterned binder layer on a protrusion of a toppan or a groove of an intaglio plate, wherein the protrusion of the toppan or the groove of the intaglio forms a circuit pattern; placing the supporting body on the patterned binder and transfer-printing the patterned binder layer on the supporting body; placing a conductive metal layer on the patterned binder layer; applying a pressure to press and fix a part of the conductive metal layer on the patterned binder layer, and curing the patterned binder layer to form the patterned conductive metal layer having the circuit pattern on the supporting body; and removing another part of the conductive metal layer not pressed and fixed.

9. The manufacturing method according to claim 7, further comprising: disposing a light resistant releasing layer on the conductive metal layer and placing the conductive metal layer having the light resistant releasing layer on the patterned binder layer and peeling off the light resistant releasing layer and the another part of the conductive metal layer attached to the light resistant releasing layer to remove another part of the conductive metal layer not pressed and fixed.

10. The manufacturing method according to claim 1, wherein forming the conductive circuit comprises: forming a patterned conductive ink layer having a polymer or adhesive and a conductive material on the supporting body; and curing the patterned conductive ink layer to form the conductive circuit having a circuit pattern on the supporting body.

11. The manufacturing method according to claim 1, wherein the film layer is formed on the supporting body having the electronic element and the conductive circuit by an out-mold wrapping process, a high temperature vacuum adsorption process, a hot pressing process, an ultrasonic melting process, a melt bonding process or an adhesive bonding process.

12. A thinned electronic product, comprising: a supporting body; a conductive circuit formed on a first surface of the supporting body; an electronic element disposed on the conductive circuit, wherein the electronic element is electrically connected to the conductive circuit; and a film layer formed on the conductive circuit having the electronic element, wherein the electronic element and the conductive circuit are wrapped between the supporting body and the film layer, wherein the conductive circuit is made of a conductive metal layer and the conductive metal layer is a metal foil, and a patterned ink layer is disposed on the supporting body, and the conductive metal layer is hot pressed and fixed on the patterned ink layer to be patterned to form the conductive circuit.

13. The thinned electronic product according to claim 12, wherein the conductive circuit is made of a conductive metal layer and the conductive metal layer is a metal foil, and the conductive metal layer having a circuit pattern is disposed on the supporting body, and the conductive metal layer contains a binder through which the conductive metal layer is fixed on the supporting body to form the conductive circuit having the circuit pattern.

14. The thinned electronic product according to claim 12, wherein the conductive circuit is made of a conductive metal layer and the conductive metal layer Is a metal foil, and a patterned binder layer is formed on the supporting body, and the conductive metal layer is pressed and fixed on the patterned binder layer to be patterned to form the conductive circuit.

15. The thinned electronic product according to claim 12, wherein the conductive circuit is a patterned conductive ink layer fixed on the supporting body.

16. The thinned electronic product according to claim 12, wherein the film layer is a single-layer or multi-layer structure, the film layer comprises a functional film layer formed by at least one layer selected from a group composed of a heat dissipation layer, a light guide layer, an external view ink layer, a waterproof layer, an adhesive layer, an electromagnetic wave shielding layer, a chemical resistant layer and a supporting layer.

17. The thinned electronic product according to claim 12, further comprising a structural function component disposed on a second surface of the supporting body, wherein the first surface is opposite to the second surface, the structural function component is a reinforced structure or a joint structure, and when the structural function component is a joint structure, the thinned electronic product further comprises another component jointed to the supporting body through the joint structure.

18. The thinned electronic product according to claim 17, wherein the joint structure comprises a buckling structure or a positioning structure.

* * * * *